US008994065B2

(12) United States Patent
Menard et al.

(10) Patent No.: US 8,994,065 B2
(45) Date of Patent: Mar. 31, 2015

(54) HIGH-VOLTAGE VERTICAL POWER COMPONENT

(71) Applicants: STMicroelectronics (Tours) SAS, Tours (FR); Universite Francois Rabelais, Tours Cedex 1 (FR)

(72) Inventors: Samuel Menard, Tours (FR); Gaël Gautier, Veretz (FR)

(73) Assignees: STMicroelectronics (Tours) SAS, Tours (FR); Universite Francois Rabelais, Tours (FR)

( * ) Notice: Subject to any disclaimer, the term of this patent is extended or adjusted under 35 U.S.C. 154(b) by 135 days.

(21) Appl. No.: 13/901,494

(22) Filed: May 23, 2013

(65) Prior Publication Data

US 2013/0320395 A1 Dec. 5, 2013

(30) Foreign Application Priority Data

May 30, 2012 (FR) ...................................... 12 54987

(51) Int. Cl.
*H01L 29/747* (2006.01)
*H01L 29/74* (2006.01)
*H01L 29/66* (2006.01)
*H01L 29/06* (2006.01)

(52) U.S. Cl.
CPC .......... *H01L 29/74* (2013.01); *H01L 29/66386* (2013.01); *H01L 29/747* (2013.01); *H01L 29/0646* (2013.01); *H01L 29/0649* (2013.01); *H01L 29/0661* (2013.01)
USPC ....................................................... 257/119

(58) Field of Classification Search
CPC .............. H01L 29/747; H01L 29/0649; H01L 21/3063; H01L 29/0661; H01L 29/0646
USPC ....................................................... 257/119
See application file for complete search history.

(56) References Cited

U.S. PATENT DOCUMENTS

| 4,180,416 | A | * | 12/1979 | Brock ........................... 438/441 |
| 2004/0048444 | A1 | * | 3/2004 | Seo ............................... 438/427 |
| 2009/0023268 | A1 | * | 1/2009 | Wu et al. ....................... 438/444 |
| 2011/0210372 | A1 | | 9/2011 | Menard et al. |
| 2013/0161757 | A1 | * | 6/2013 | Huang et al. .................. 257/369 |

FOREIGN PATENT DOCUMENTS

JP             55166957 A        12/1980

OTHER PUBLICATIONS

French Search Report and Written Opinion dated Jan. 29, 2013 from corresponding French Application No. 12/54987.
Nakajima S. et al., "An Isolation Technique for High Speed Bipolar Integrated Circuits," Review of the Electrical Communication Laboratories, vol. 25, No. 9-10, Sep. 1997-Oct. 1997, pp. 1039-1051, XP009162177, Aoyama Daiichi Publ. Co. Ltd., JP.

\* cited by examiner

*Primary Examiner* — Steven J Fulk
(74) *Attorney, Agent, or Firm* — Allen, Dyer, Doppelt, Milbrath & Gilchrist, P.A.

(57) ABSTRACT

A vertical power component including: a silicon substrate of a first conductivity type; on the side of a lower surface of the substrate supporting a single electrode, a lower layer of the second conductivity type; and on the side of an upper surface of the substrate supporting a conduction electrode and a gate electrode, an upper region of the second conductivity type, wherein the component periphery includes, on the lower surface side, a porous silicon insulating ring penetrating into the substrate down to a depth greater than that of the lower layer.

7 Claims, 2 Drawing Sheets

HIGH-VOLTAGE VERTICAL POWER COMPONENT

CROSS REFERENCE TO RELATED APPLICATIONS

This application claims the priority benefit of France patent application number 12/54987, filed on May 30, 2012, which is hereby incorporated by reference to the maximum extent allowable by law.

BACKGROUND

1. Technical Field

The present disclosure relates to a vertical power component capable of withstanding a high voltage (typically, greater than 500 V), and more specifically aims at the peripheral structure of such a component.

2. Discussion of the Related Art

FIG. 1 is a cross-section view of a vertical power component, illustrating a way of forming the periphery of a component in so-called "planar" technology to protect the component edges.

The component shown in this example is a triac comprising a lightly-doped N-type silicon substrate 1 (N⁻), with a doping currently ranging from $10^{14}$ to $10^{15}$ atoms/cm$^3$, having its upper surface comprising a P-type doped well 3 (P) extending almost over the entire surface of the component, except at the periphery thereof, and having its lower surface comprising a P-type doped layer 5 (P) extending over the entire surface of the component. Upper well 3 contains a heavily-doped N-type region 4 (N⁺) and lower layer 5 contains a heavily-doped N-type region 6 (N⁺) in an area substantially complementary (in top view) to that occupied by region 4. Upper well 3 further contains a small heavily-doped N-type region 8 (N⁺). On the lower surface side of the component, a conduction electrode A2 coats the entire component surface, and on the upper surface side, a conduction electrode A1 coats region 4 and a portion of well 3, a gate electrode G coats region 8 and a portion of well 3, and an insulating layer 9, for example, made of silicon oxide, coats the portions of the upper surface which are not covered with electrodes. Whatever the biasing between electrodes A2 and A1, if a gate control is provided, the component becomes conductive. The conduction occurs from electrode A2 to electrode A1 through a vertical thyristor comprising regions 5, 1, 3, and 4, or from electrode A1 to electrode A2 through a vertical thyristor comprising regions 3, 1, 5, and 6. The thickness and the doping level of substrate 1 are calculated so that the triac, in the off state, can withstand high voltages, for example, voltages ranging between 600 and 800 volts.

The triac is fully surrounded with a P-type doped diffused wall 11 (P) formed from the lower and upper surfaces of the substrate and extending across the entire substrate thickness. On the lower surface side of the component, layer 5 laterally extends all the way to diffused wall 11 and, on the upper surface side, well 3 stops before diffused wall 11. Wall 11 especially has the function of insulating the lateral surfaces of substrate 1 and thus of avoiding possible short-circuits of the component due to solder rises when lower electrode A2 of the component is soldered to a contact area of an external device. To avoid the occurrence of breakdowns at the component edges, a distance should be provided between the limit of P-type well 3 and diffused wall 11. In this example, a heavily-doped N-type channel stop ring 13 (N⁺) is further arranged between well 3 and wall 11 and surrounds well 3.

A disadvantage of the structure of FIG. 1 has to do with the presence of a parasitic lateral bipolar transistor formed by P-type well 3 (emitter), N-type substrate 1 (base), and diffused P-type wall 11 (collector). Such a parasitic lateral transistor adversely affects the component performance in certain usage configurations. In particular, the presence of this transistor causes a decrease in the start sensitivity in quadrant Q4, that is, when a negative voltage is applied between electrodes A1 and A2 and when the component is started by application of a positive current on gate G. In other words, the presence of this transistor causes an increase in the intensity of the gate current necessary for a start in quadrant Q4. Further, the presence of the parasitic lateral transistor causes a decrease of the speed at which the component switches from the on state to the off state when the voltage between electrodes A1 and A2 switches from a positive value to a negative value.

To decrease the influence of the lateral parasitic transistor, it is known to provide a doping of the substrate with gold or with platinum, or an electron irradiation of the substrate, to decrease the lifetime of minority carriers in the base region of the PNP transistor, and thus decrease the transistor gain. Such a doping or such an irradiation however has the disadvantage of adversely affecting the conduction performance of the component (increase of the on-state voltage drop), of decreasing the component start sensitivity, and of increasing off-state leakage currents.

SUMMARY

An embodiment provides a peripheral high-voltage vertical power component structure overcoming at least some of the disadvantages of known peripheral structures.

An embodiment provides a vertical power component comprising: a silicon substrate of a first conductivity type; on the side of a lower surface of the substrate supporting a single electrode, a lower layer of the second conductivity type; and on the side of an upper surface of the substrate supporting a conduction electrode and a gate electrode, an upper region of the second conductivity type, wherein the component periphery comprises, on the lower surface side, a porous silicon insulating ring penetrating into the substrate down to a depth greater than that of the lower layer.

According to an embodiment, the lower layer laterally extends all the way to the insulating ring.

According to an embodiment, the component periphery further comprises, on the upper surface side, a doped ring of the second conductivity type extending vertically in the substrate all the way to the insulating ring.

According to an embodiment, the upper region is a well laterally stopping before the doped ring.

According to an embodiment, the component periphery further comprises, on the upper surface side, a porous silicon insulating ring penetrating into the substrate down to a depth greater than that of the upper region.

According to an embodiment, the upper insulating ring extends vertically in the substrate all the way to the lower insulating ring.

According to an embodiment, the upper insulating ring vertically stops before the lower insulating ring, an intermediate ring of the second conductivity type separating the lower edge of the upper insulating ring from the upper edge of the lower insulating ring.

According to an embodiment, the upper region is a layer laterally extending all the way to the upper insulating ring.

According to an embodiment, the above-mentioned component forms a triac, wherein: a first heavily-doped region of the first conductivity type extends in a portion of the upper region, the first region and a portion of the upper region being in contact with a first conduction electrode; a second heavily-doped region of the first conductivity type extends in a portion of the upper region, the second region and a portion of the upper region being in contact with a gate electrode; and a third heavily-doped region of the first conductivity type, substantially complementary in projection to the first region, extends in a portion of the lower layer, the third region and a portion of the lower layer being in contact with a second conduction electrode.

According to an embodiment, the silicon substrate is of type N.

BRIEF DESCRIPTION OF THE DRAWINGS

The foregoing and other features and advantages will be discussed in detail in the following non-limiting description of specific embodiments in connection with the accompanying drawings.

For clarity, the same elements have been designated with the same reference numerals in the different drawings and, further, as usual in the representation of integrated circuits, the various drawings are not to scale.

DETAILED DESCRIPTION

Figure 2:
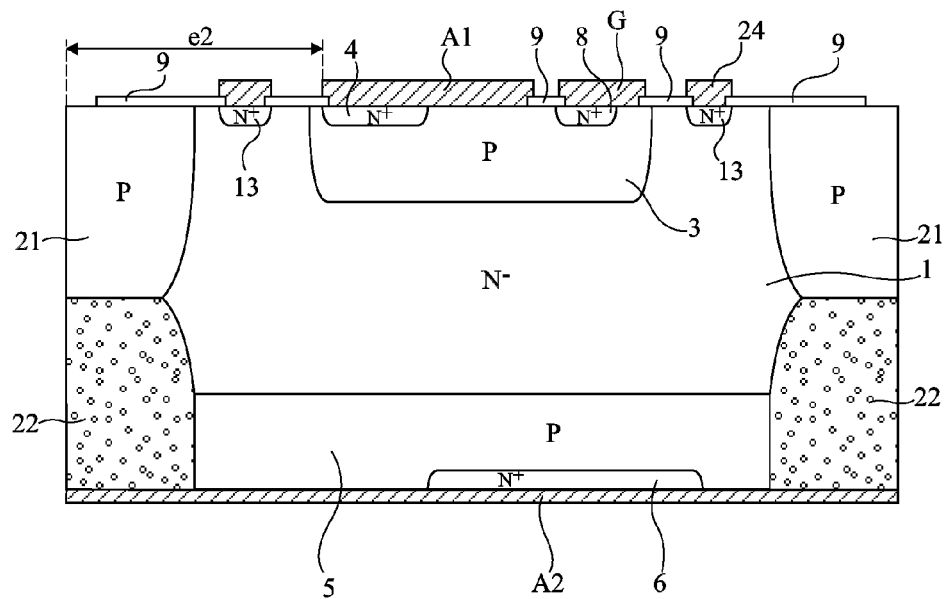
FIG. 2 is a cross-section view showing an embodiment of a high-voltage vertical power component peripheral structure.

FIG. 2 is a cross-section view showing a preferred embodiment of a high-voltage vertical power component peripheral structure.

Figure 1:
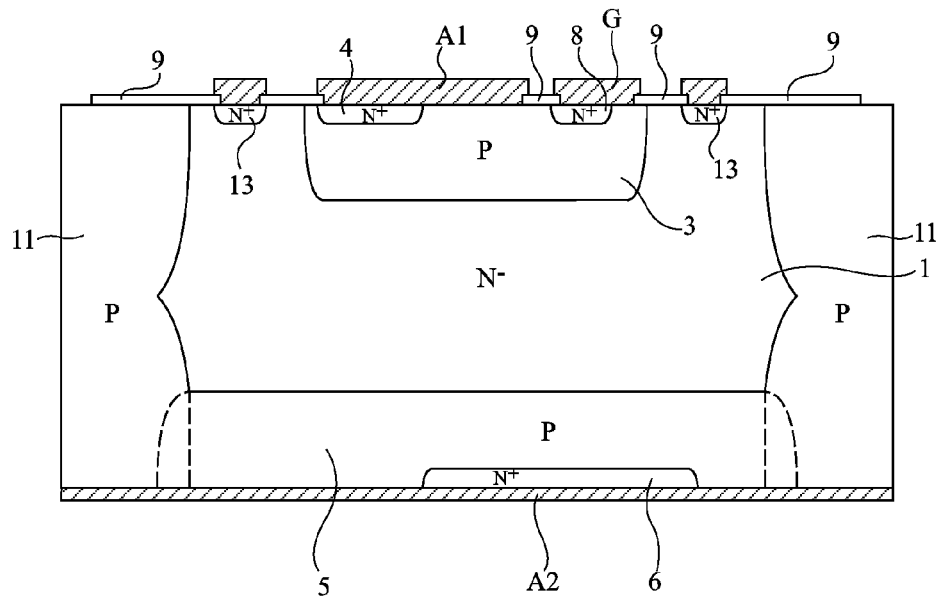
FIG. 1, previously described, is a cross-section view showing an example of a known high-voltage power component peripheral structure.

FIG. 2 shows a triac having its different elements designated with the same reference numerals as the corresponding elements of the triac of FIG. 1. The component of FIG. 2 differs from the component of FIG. 1 in that, on its lower surface side, a lower portion of the diffused peripheral wall which surrounds the component (wall 11 of FIG. 1) has been turned into a porous silicon insulating region. Thus, at the periphery of the component of FIG. 2, a P-type doped diffused wall portion 21 penetrating down to a given depth into substrate 1, and, on the lower surface side, substantially in front of diffused wall portion 21, a porous silicon ring-shaped insulating region 22 penetrating into substrate 1 down to a depth greater than that of layer 5 and joining diffused region 21, can be found. In the shown example, diffused wall portion 21 and ring-shaped insulating region 22 approximately join in in the middle of the substrate thickness. The described embodiments are however not limited to this specific case. More generally, insulating region 22 for example extends down to a depth ranging between one quarter and three quarters of the substrate thickness. The depth of ring-shaped insulating region 22 must preferably be selected to be sufficiently large to minimize the risk, on assembly of the component, for solder rises to short-circuit electrode A2 and diffused wall portion 21. As an example, insulating region 22 preferably extends down to a depth of at least 75 µm.

An advantage of the embodiment of FIG. 2 is that the parasitic lateral transistor formed by P-type well 3 (emitter), N-type substrate 1 (base), and P-type diffused wall portion 21 (collector) is insulated by porous silicon ring-shaped region 22. In other words, in the component of FIG. 2, the collector of the lateral parasitic PNP transistor is floating, instead of being connected to electrode A2 as in the structure of FIG. 1. Tests carried out by the present inventors have shown that the structure of FIG. 2 provides better start sensitivity, in particular in quadrant Q4, than the structure of FIG. 1. Further, the structure of FIG. 2 provides a significantly higher component switching speed from the on state to the off state than with the structure of FIG. 1. Such advantages are obtained without it being necessary to use a processing of the substrate to decrease the lifetime of minority carriers (for example, a gold or platinum doping, or an electron irradiation). Thus, the structure of FIG. 2 provides a better compromise between the switching speed, the conduction performance, the start sensitivity, and off-state leakage currents, than known structures. Tests carried out by the present inventors have further shown that the provided modification causes no decrease of the off-state breakdown voltage of the component with respect to the structure of FIG. 1.

As an example, to form the structure of FIG. 2, it is started from a wafer of a lightly-doped N-type silicon substrate 1, and a P-type diffused ring-shaped wall vertically extending across the entire substrate thickness and delimiting a substrate portion where the component will be formed. As an example, substrate 1 has a thickness ranging between 200 and 300 µm, for example, being on the order of 250 µm, and the wall is formed by diffusion of boron atoms, with a surface concentration approximately ranging from $5*10^{17}$ to $5*10^{18}$ atoms/cm$^3$, for example, being on the order of $10^{18}$ atoms/cm$^3$, from the front and rear surfaces of the substrate. The diffusion depth is selected to be greater than or equal to half the substrate thickness, so that the upper and lower diffused regions join in the middle of the substrate thickness. Diffused regions 3, 5, 4, 6, and 8 of the component can then be formed. As an example, regions 3 and 5 are formed by diffusion of boron atoms down to a depth approximately ranging from 20 to 50 µm, for example, on the order of 35 µm, with a surface concentration approximately ranging from $10^{18}$ to $10^{19}$ atoms/cm$^3$, for example, on the order of $5*10^{18}$ atoms/cm$^3$. Regions 4, 6, and 8 may be formed by diffusion of phosphorus atoms down to a depth approximately ranging from 5 to 15 µm, for example, on the order of 10 µm, with a surface concentration approximately ranging from $5*10^{19}$ to $3*10^{20}$ atoms/cm$^3$, for example, being on the order of $10^{20}$ atoms/cm$^3$. Insulating porous silicon ring-shaped region 22, which actually corresponds to a lower portion of the diffused ring-shaped wall which is made porous, for example, by an electrochemical dissolution method, can then be formed. As an example, lower and upper insulating protection layers are formed on the lower and upper surfaces of the semiconductor wafer, these layers comprising openings in front of the lower and upper surfaces of the ring-shaped diffused wall. The protection layers are, for example, made of silicon nitride. The wafer can then be dipped in an electrolytic solution based on hydrofluoric acid between two electrodes, so that a current flows between the two electrodes, through the electrolytic solution and the diffused wall. The negative electrode is placed on the lower surface side of the wafer, and the positive electrode is on the upper surface side. On the negative electrode side (lower surface), a reaction resulting in progressively turning the heavily-doped P-type silicon of the ring-shaped wall into porous silicon 40 occurs. This reaction essentially occurs in front of the openings formed in the lower protection layer and remains confined to the heavily-doped P-type portion corresponding to the lower portion of the wall. The duration of the electrochemical etching and the intensity of the current flowing between the electrodes determine the degree of porosity (pore percentage) and the depth of ring-shaped region 22. The insulating properties of region 22 depend on the degree of porosity of silicon, which may be selected by adjusting the electrolysis parameters. As an example, a region 22 having a degree of porosity approximately ranging from 30 to 70%, and preferably approximately ranging from 50 to 60%, may be formed. After the electrochemical etching, a step of oxidation of porous silicon 22 may be provided, which enables to improve its insulating properties. It should be noted that it is preferable to provide forming porous silicon region 22 after the forming of the various diffused regions of the component (regions 3, 5, 4, 6, and 8 in this example). Indeed, if region 22 were formed before the diffused regions of the component, the various trench anneals, associated with the forming of the diffused regions, would risk damaging the porous silicon.

Figure 3:
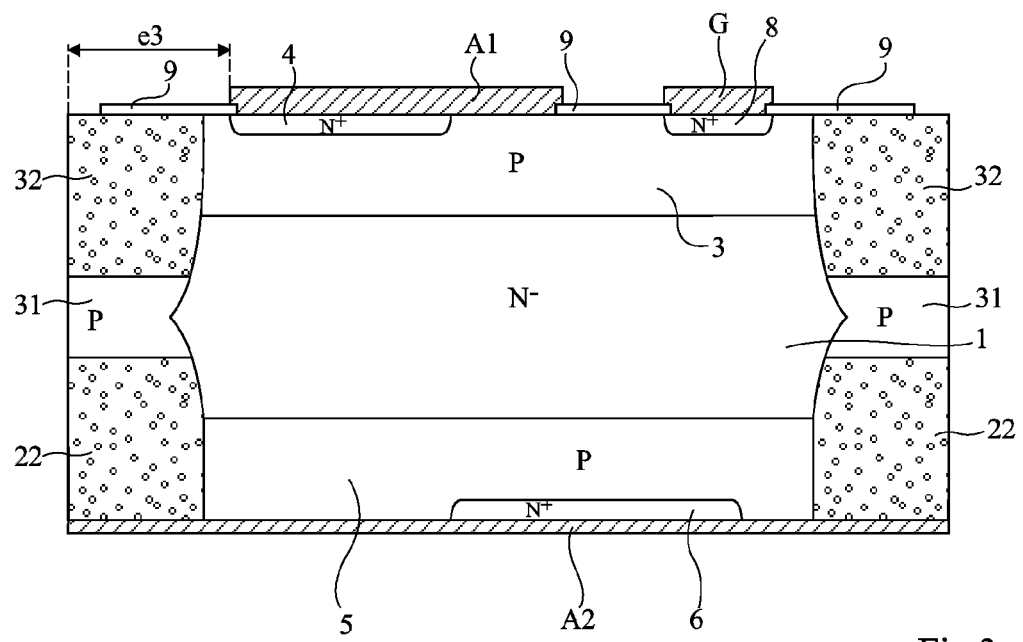
FIG. 3 is a cross-section view showing another embodiment of a high-voltage vertical power component peripheral structure.

FIG. 3 is a cross-section view showing another embodiment of a high-voltage vertical power component peripheral structure. FIG. 3 shows a triac having its different elements designated with the same reference numerals as the corresponding elements of the triacs of FIGS. 1 and 2.

At the periphery of the component of FIG. 3, one can find, on the lower surface side, a lower porous silicon ring-shaped insulating region 22 penetrating into the substrate down to a depth greater than that of P-type layer 5 and, on the upper surface side, substantially in front of region 22, an upper porous silicon ring-shaped insulating region 32 penetrating into the substrate down to a depth greater than that of P-type region 3. In the shown example, regions 22 and 32 do not join and a floating intermediate P-type doped silicon ring 31 separates the lower edge of ring 32 from the upper edge of ring 22. In an alternative embodiment, it may be provided for rings 22 and 32 to join in order to form, together, a peripheral porous silicon ring-shaped wall extending across the entire substrate thickness. On the upper and lower surface sides, respectively, P-type region 3 laterally extends all the way to ring-shaped insulating region 32, and P-type region 5 laterally extends all the way to ring-shaped insulating region 22.

An advantage of the structure of FIG. 3 is that it requires, to be formed, a smaller number of masks than the structure of FIG. 2. Indeed, in the structure of FIG. 3, upper P-type region 3 forms a layer which extends over the entire upper surface of the component. Thus, its forming requires no mask, unlike P-type well 3 of the structure of FIG. 2, which must be local.

Another advantage is that, in the structure of FIG. 3, on the front surface side, distance e3 between the component edge and the limit of upper passivation layer 9 (beginning of electrode A1 or G, respectively) is greater than distance e2 between the component edge and the limit of the upper passivation layer in the structure of FIG. 2. Thus, in the structure of FIG. 3, the surface area available for the component electrodes is much greater than in the structure of FIG. 2; or, for given electrode surface area values, the total surface area of the component of FIG. 3 is smaller than that of the component of FIG. 2, which amounts to decreasing its cost.

To form the structure of FIG. 3, a method of the type described in relation with FIG. 2, which comprises two separate steps of electrochemical dissolution of the heavily-doped P-type diffused ring-shaped wall delimiting the component instead of a single one, may for example be used. As an example, a first electrochemical dissolution step, similar to that described in relation with FIG. 2, is provided to form lower insulating region 22 of the structure of FIG. 3. A second electrochemical dissolution step can then be provided by inverting the electrode biasing, to form upper insulating region 32 of the structure.

Specific embodiments have been described. Various alterations, modifications, and improvements will readily occur to those skilled in the art.

In particular, vertical power component structures have been described hereabove with the example of the case where the component is a triac. The provided embodiments are not limited to this specific case. It will be within the abilities of those skilled in the art to adapt the provided structures to other components, comprising:
an N-type silicon substrate;
on the side of a lower surface supporting a single electrode, a P-type semiconductor layer; and
on the side of an upper surface supporting at least one conduction electrode and one gate electrode, a P-type semiconductor region.

As an example, it will be within the abilities of those skilled in the art to adapt the provided structures to the case where the high-voltage vertical component is a thyristor.

Further, the embodiment of FIG. 2 is not limited to the shown example where the structure comprises a channel stop ring 13 between P-type well 3 and diffused wall portion 21.

Further, the embodiments are not limited to the examples of manufacturing methods described in relation with FIGS. 2 and 3. It will be within the abilities of those skilled in the art to form the provided structures by any other adapted method.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical power component comprising:
a silicon substrate of a first conductivity type;
a lower semiconductor region of a second conductivity type on a lower surface of the silicon substrate;
a lower electrode on the lower semiconductor region;
an upper semiconductor region of the second conductivity type on an upper surface of the silicon substrate;
a gate electrode and an upper electrode both on an upper surface of the upper semiconductor region;
a porous silicon lower insulating ring at a periphery of the lower semiconductor region and silicon substrate and extending vertically upward from the lower electrode beyond the lower semiconductor region; and
a porous silicon upper insulating ring at a periphery of the upper semiconductor region and silicon substrate and extending vertically downward from aligned with an upper surface of said upper semiconductor region beyond the upper semiconductor region and defining a gap with adjacent portions of the porous silicon lower insulating ring.

2. The component of claim 1, wherein said lower semiconductor region laterally extends to said porous silicon lower insulating ring.

3. The component of claim 1, further comprises a doped ring of the second conductivity type in the gap defined between the lower and upper porous silicon insulating rings.

4. The component of claim 3, wherein said upper semiconductor region is a well laterally stopping before said doped ring.

5. The component of claim 1, wherein said upper semiconductor region extends laterally to said porous silicon upper insulating ring.

6. The component of claim 1, further comprises:
- a first heavily-doped region of the first conductivity type extending in a portion of said upper semiconductor region, said first heavily-doped region and a portion of said upper semiconductor region being in contact with the upper electrode;
- a second heavily-doped region of the first conductivity type extending in a portion of said upper semiconductor region, said second heavily doped region and a portion of said upper region being in contact with the gate electrode; and
- a third heavily-doped region of the first conductivity type extending in a portion of said lower semiconductor region, said third heavily-doped region and a portion of said lower semiconductor region being in contact with the lower electrode.

7. The component of claim 1, wherein the silicon substrate is of N-type.

* * * * *